（12） United States Patent
Meier et al.

(10) Patent No.: US 6,385,275 B1
(45) Date of Patent: May 7, 2002

(54) ASSEMBLY FOR GENERATING A CONSECUTIVE COUNT

(75) Inventors: Herbert Meier, Moosburg; Thomas Flaxl, Dachau/Mitterndorf, both of (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/667,412

(22) Filed: Sep. 21, 2000

(30) Foreign Application Priority Data

Sep. 24, 1999 (DE) .......................................... 199 45 952

(51) Int. Cl.[7] ................................................. G06M 3/00
(52) U.S. Cl. ........................... 377/26; 377/333; 365/236
(58) Field of Search ............................ 365/236; 377/26, 377/33

(56) References Cited

U.S. PATENT DOCUMENTS 5,602,789 A * 2/1997 Endah et al. ................ 365/201
5,944,837 A * 8/1999 Talreja et al. ............... 713/600

* cited by examiner

*Primary Examiner*—Margaret R. Wambach
(74) *Attorney, Agent, or Firm*—William B. Kempler; Frederick J. Telecky, Jr.

(57) ABSTRACT

An assembly for generating a consecutive count includes an n-stage binary counter (24) incrementable by counting pulses in successive cycles and an EEPROM (10) in which an item of information representing the count achieved in each case is stored in the pauses between the cycles. The EEPROM (10) comprises n+1 memory cells. A control circuit (36) is provided causing the contents of the n−1 stages of the binary counter (24) assigned to the most-significant bits to be stored in the n−1 first memory cells of the EEPROM (10) and the contents of the $n^{th}$ or $(n+1)^{th}$ memory cell is changed in alternate cycles. On commencement of each cycle the contents of the n−1 first memory cells of the EEPROM (10) is transferred into the corresponding stages of the binary counter (24) and a bit is written into the $n^{th}$ stage of the binary counter (24) formed by linking the contents of the $n^{th}$ and $(n+1)^{th}$ memory cells of the EEPROM (10) such that the count corresponds to the count attained in the previous cycle, whereby the counting pulse then increments the binary counter (24) to the next count.

4 Claims, 2 Drawing Sheets

FIG. 2

Figure 1:
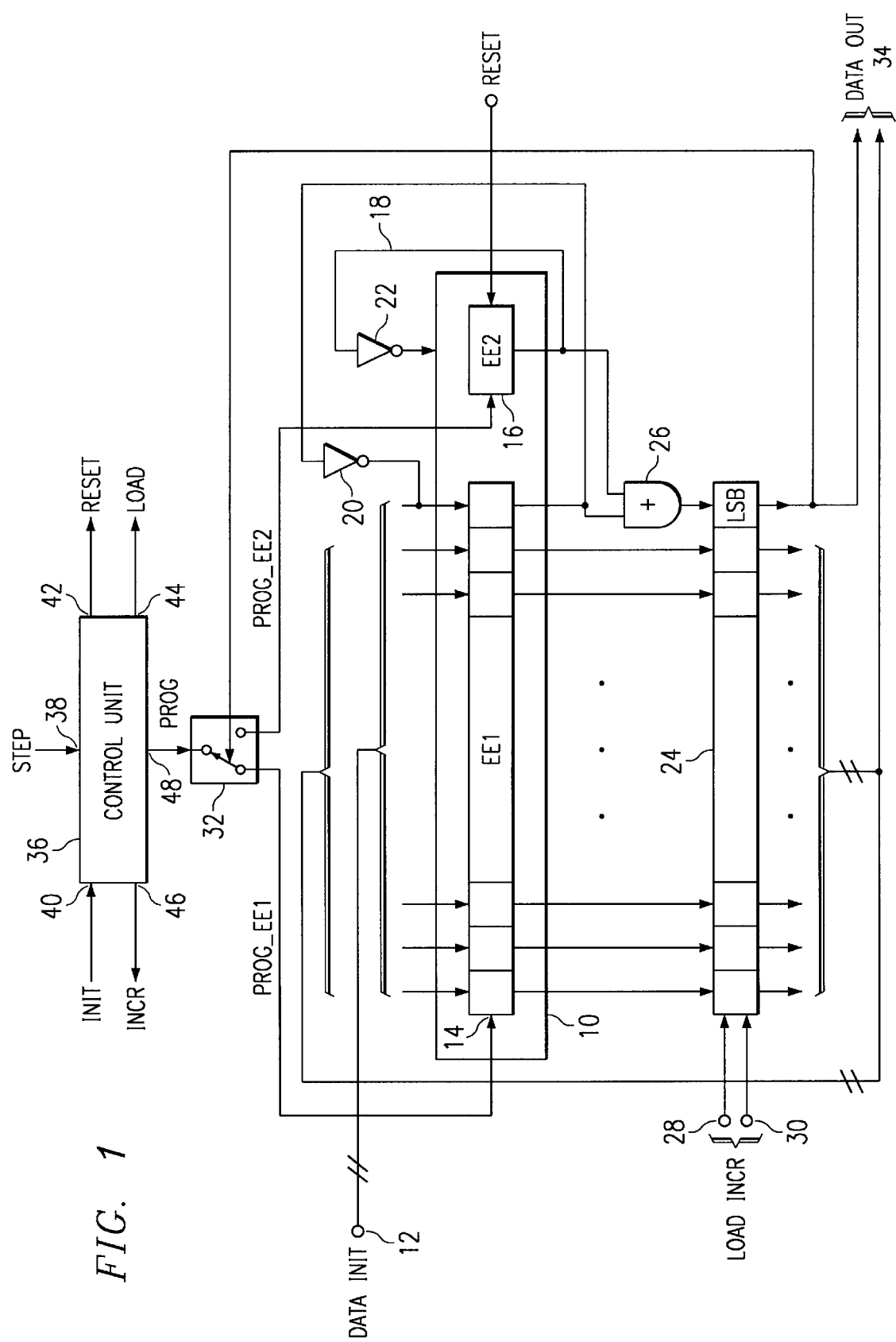

| | EE1 | EE2 | XOR | CNT | PROG | |
|---|---|---|---|---|---|---|
| CYCLE 0 [INIT DATA] | 000 | 0 | X | X | EE1+RESET | DATA OUT (0) |
| CYCLE 1 [LOAD / INCR / PROG_EE2] | 000 / 000 / 000 | 0 / 0 / 1 | 0 / 0 / 1 | 000 / 000 / 001 | EE2 | DATA OUT (1) |
| CYCLE 2 [LOAD / INCR / PROG_EE1] | 000 / 000 / 011 | 1 / 1 / 1 | 1 / 1 / 0 | 001 / 001 / 010 | EE1 | DATA OUT (2) |
| CYCLE 3 [LOAD / INCR / PROG_EE2] | 011 / 011 / 011 | 1 / 1 / 0 | 0 / 0 / 1 | 010 / 010 / 011 | EE2 | DATA OUT (3) |
| CYCLE 4 [LOAD / INCR / PROG_EE1] | 011 / 011 / 100 | 0 / 0 / 0 | 1 / 1 / 0 | 011 / 011 / 100 | EE1 | DATA OUT (4) |
| CYCLE 5 [LOAD / INCR / PROG_EE2] | 100 / 100 / 100 | 0 / 0 / 1 | 0 / 0 / 1 | 100 / 100 / 101 | EE2 | DATA OUT (5) |
| CYCLE 6 [LOAD / INCR / PROG_EE1] | 100 / 100 / 111 | 1 / 1 / 1 | 1 / 1 / 0 | 101 / 101 / 110 | EE1 | DATA OUT (6) |
| CYCLE 7 [LOAD / INCR / PROG_EE2] | 111 / 111 / 111 | 1 / 1 / 0 | 0 / 0 / 1 | 110 / 110 / 111 | EE2 | DATA OUT (7) |
| CYCLE 7 [LOAD / INCR / PROG_EE1] | 111 / 111 / 000 | 0 / 0 / 0 | 1 / 1 / 0 | 111 / 000 / 000 | EE1 | |

ASSEMBLY FOR GENERATING A CONSECUTIVE COUNT

The invention relates to an assembly for generating a consecutive count including an n-stage binary counter incrementable by counting pulses in successive cycles and an EEPROM in which an item of information representing the count achieved in each case is stored in the pauses between the cycles.

There are applications in which it is necessary to generate a consecutive count, whereby between the individual counting cycles optionally long pauses may exist, on the timeout of which counting is recontinued from the last count. For example, coding systems exist in which the corresponding count is linked to a covert code for generating a so-called signature in making use of a coding algorithm. This signature is then sent to a receiver which in making use of the same count and the covert code known to it, is able to check the received signature as the whether it originates from an authorized sender. Security of transmission is enhanced by making use of the count not recognizable to the outside together with the covert code.

So that the count is incremented from the previous count after a pause it is necessary to store an item of information representing the attained count. When a voltage source is available, storing is no problem since semiconductor memories are available which may serve this purpose. Indeed, even in integrated circuits such a storage may be implemented with no problem as long as a voltage source is always available.

Semiconductor memories also exist in which the stored information is saved when they are disconnected from the power source. Such a memory is termed an electrically erasable programmable read-only memory or, in short, EEPROM, the contents of which is erasable by applying corresponding electrical voltages and enabling information to be written into the individual memory cells.

The disadvantage with an EEPROM is, however, that the manufacturer is able to guarantee only a restricted number of safe storage operations. As soon as this number is exceeded it can no longer be guaranteed that an item of information entered in a memory cell is safely retrievable. One popular value for this number of storage operations is currently 100 000. When the binary numbers to be stored in sequence in such a memory are optional, this maximum number of safe storage operations is very large as long as the contents of each memory cell does not need to be changed in every storage operation. However, the worst case is when a consecutive count needs to be stored since then the contents of the EEPROM memory cell storing the least-significant bit of the count changes on every storage operation. In storing consecutive counts an EEPROM actually becomes unsafe once the cited 100 000 storage cycles is attained. There are applications, however, in which this number of safe storage operations in inadequate.

A general object of the invention is to provide an assembly of the aforementioned kind enabling the number of safe storage operations of an EEPROM to be increased.

In accordance with one aspect of the invention the assembly for generating a consecutive count including an n-stage binary counter incrementable by counting pulses in successive cycles and an EEPROM in which an item of information representing the count achieved in each case is stored in the pauses between the cycles is characterized in that the EEPROM comprises n+1 memory cells;

a control circuit is provided causing the contents of the n−1 stages of the binary counter assigned to the most-significant bits to be stored in the n−1 first memory cells of the EEPROM and the contents of the $n^{th}$ or $(n+1)^{th}$ memory cell is changed in alternate cycles;

on commencement of each cycle the contents of the n−1 first memory cells of the EEPROM is transferred into the corresponding stages of the binary counter and a bit is written into the $n^{th}$ stage of the binary counter formed by linking the contents of the $n^{th}$ and $(n+1)^{th}$ memory cells of the EEPROM such that the count corresponds to the count attained in the previous cycle, whereby the counting pulse them increments the counter to the next count.

In the assembly in accordance with one aspect of the invention the EEPROM comprises one cell more than the digits of the count generated by the n-stage binary counter, thus making it possible for the control circuit to increment the counter and storage operation so that a cell is no longer available in the EEPROM which changes its contents on each storage operation. It is only the two last cells of the EEPROM that change their status alternately in every second cycle, resulting in the number of safe storage operations being doubled.

Advantageous further embodiments of the invention are characterized in the sub-claims.

The invention will now be explained by way of an example with reference to the drawing in which:

FIG. 1 is a schematic circuit diagram of the assembly in accordance with the invention and FIG. 2 is a Truth Table assisting in explaining how the assembly in accordance with the invention works.

Referring now to FIG. 1 there is illustrated the assembly containing as its central component an EEPROM 10. This memory is a semiconductor memory having individual memory cells in which binary values can be stored in the form of electrical charges. The storage of binary values in the individual cells results from the application of suitable voltages, whereby depending on the choice of the applied voltages write, read or erase operations are implementable. The way in which such memories work is known and thus does not need to be detailed in the present. Details in this respect are evident, for example, from the 1993 2nd. Edition of the dictionary "Lexikon Elektrotechnik und Mikroelektronik" published by VDI Verlag under item "EAROM". Storing items of information in the individual cells is termed "programming" as a rule.

As evident from FIG. 1 the EEPROM 10 consists of a section EE1 and a section EE2. Section EE1 contains in the example illustrated 32 memory cells, whilst section EE2 consists only of one, single memory cell.

The EEPROM 10 contains a data input via which data initializing the memory is input. This data input 12 is a terminal having 32 individual lines leading to the internal data inputs of the 32 memory cells of the EEPROM 10. Furthermore, the EEPROM 10 contains a programming input 14. A programming signal applied to this input 14 results in the data at the data inputs of the individual memory cells being accepted and stored, i.e. programmed. The programming input 14 leads to all 32 memory cells of the section EE1 of the EEPROM 10. Section EE2 of the EEPROM 10 comprises its own programming input 16. Furthermore, this section EE2 comprises a reset input 18 enabling the individual memory cells to be set to a desired initial status by application of a reset signal.

Provided in each case between the output of the last stage of section EE1 and the input thereof as well as between the last output of section EE2 and the input thereof is a link via a negator 20 and 22 respectively. This link achieves reprogramming in the corresponding memory cell on receiving a programming signal, i.e. the binary value last stored in the cell is changed into the corresponding other binary value.

The assembly as shown in FIG. 1 contains furthermore a binary counter 24 comprising 32 counter stages. The inputs of the first 31 counter stages are directly connected to the outputs of the first 32 cells of section E1 of the EEPROM 10. The last stage of the counter 24 is connected to the output of an antivalence circuit 26 comprising an input connected to the output of the last memory cell of section EE1 and an input connected to the output of the memory cell forming section EE2. The binary counter 24 comprises as usual a load input 28 and an incrementing input 30. A signal applied to the load input 28 results in the data applied to the inputs of the individual counter stages being programmed into the counter stages whilst a signal applied to the incrementing input 20 results in the count of the counter being elevated by one step in the count. The outputs of the 31 first stages of the counter 24 are connected to the 31 first inputs of section EE1 of the EEPROM 10, whilst the output of the last stage LSB is connected to the control input of a selector switch 32, the purpose of which will be later explained. The binary values present at outputs of the counter 24 are retrievable at the outputs 34 at a specific point in time within the sequencing cycle (also to be later explained) of the assembly as shown in FIG. 1 as the DATA OUT count to be generated.

A control unit 36 serves to control the operations sequencing in the cycles in generating the consecutive count. This control unit comprises an input 38 to which a STEP activating signal may be applied which in each case activates a cycle for generating a count. To a further input 40 an INIT initializing signal may be applied resulting in initialization of the assembly, with the aid of which a specific initial status is to be set (also to be later explained) and which is supplied as DATA INIT to the inputs of all 32 cells of section EE1. At the output 42 the control unit 36 outputs a RESET signal serving to set section EE2 of the EEPROM 10 into a specific initial status. At the further outputs 44, 46 and 48 the control unit 36 outputs in sequence on receiving the STEP activating signal the control signals LOAD, INCR or PROG, the purpose of which will be likewise explained later.

It is evident that depending on the position of the switch 32, as dictated by the contents of the last stage of the binary counter 24, the control signal PROG is supplied to the programming input 14 of section EE1 of the EEPROM 10 or to the programming input 16 of section EE2 of the EEPROM 10.

Referring now to FIG. 2 there is illustrated a Truth Table illustrating the way in which the assembly as shown in FIG. 1 works as will now be explained. Illustrated in this Truth Table in eight cycles in sequence is how the contents of the sections EE1 and EE2 of the EEPROM 10 change in reaction to the control signals output by the control unit 36, whereby only the contents of the last three memory cells of section EE1 is illustrated in each case. Indicated furthermore in the column "XOR" is the binary value of the output signal of the antivalence circuit 26; the contents of the last three stages of the binary counter 24 are also evident from the column "CNT". Indicated in the "PROG" column is the memory section receiving in each case the programming signal PROG due to the position of the selector switch 32.

In a first step which is carried out only once, the assembly as shown in FIG. 1 is initialized, i.e. the cells of the EEPROM 10 are set to a specific initial value. This initial value is in each case the value 0 which is achieved by applying the values "0" to each of the 32 lines forming the input 12 and the control unit applying via the selector switch 32 the programming signal PROG to the programming input 14 of section EE1. The section EE2 of the EEPROM 10 is set with the aid of the RESET signal from the control circuit likewise to the value 0.

On first-time receipt of the STEP signal at the input 38 the control unit 36 implements the cycle 0, this involving the LOAD signal being output at the output 44 which is supplied to the input 28 of the binary counter 24. The result of this signal is that the binary counter loads into its individual stages the logical value supplied to it by the corresponding stage of section EE1 of the EEPROM 10. As evident from FIG. 1, 31 memory cells of section EE1 are connected in parallel to the corresponding stages of the binary counter 24 so that on the LOAD instruction, the contents of these 31 memory cells program the corresponding stages of the binary counter 24. The least-significant stage of the binary counter 24, termed LSB in FIG. 1, is set to the value occurring at the output of the antivalence circuit 26. Since after initialization the last memory cell of section EE1 contains the logical value "0" and also the memory cell forming section EE2 also contains the logical value "0" the antivalence circuit 26 likewise outputs a signal having the logical value "0" so that the LSB stage of the binary counter 24 is set to "0". The count thus contains the logical value "0" in all stages. This logical value is the first count retrievable at this point in time of the cycle at the output 34. Retrieval is done by a circuit not show in FIG. 1 for which the consecutive count is generated.

In further sequencing of the cycle 0 the control unit 24 then generates at the output 46 the INCR signal which is supplied to the incrementing input 30 of the binary counter 24 resulting in this count being incremented to the next count, i.e. to the count 1. As evident from the Truth Table in FIG. 2 this results in the logical value contained in the last stage LSB of the binary counter 24 being changed to the value "1", all other logical values remaining unchanged.

The change in the logical value in the LSB stage to the value "1" results in the selector switch 32 being switched to its other position in which a connection is made between the output 48 to the control unit 36 and the programming input 16 of section EE2 of the EEPROM 10.

As the last step in the cycle 0 the control unit outputs at its output 48 the PROG signal which due to the stated position of the selector switch 32 gains access to the programming input 16 of section EE2, resulting in the logical value applied to the input of this section being programmed into the memory cell forming this section. As shown in FIG. 1 this logical value is in each case the negated logical value of that existing at the output of section EE2. This negation is affected by the negator 22. Accordingly, the logical value in section EE2 is changed to the value "1", this change likewise causing the logical value at the output of the antivalence circuit 26 to change to the value "1".

In the Truth Table as shown in FIG. 2 the PROG signal is identified either PROG_EE2 or PROG_EE1 to easier distinguish whether it has been supplied to the programming input 16 of section EE2 or the programming input 14 of section EE1 in accordance with the position of the selector switch 32.

As evident from this description of the 0 cycle, all that has changed in this sequence is the contents of the memory cells forming section EE2. The contents of section EE1 remains unchanged since this section received no programming signal.

To prompt generating the next consecutive count a further STEP signal is applied to the input 38 of the control unit. To generate this count the cycle 1 as shown in FIG. 2 is sequenced, the control unit then again outputting at its output 44 the LOAD signal, resulting in the binary counter being set to the count existing at the end of the previous cycle. In the following case this was the count 1. At end of this step the next consecutive count, i.e. the count "1" is available at the output 34 for further use.

The control unit 36 now outputs at its output 46 the INCR signal, resulting in the binary counter 24 being incremented by one count step so that it then has the count 2. The change in the LSB stage of the binary counter 24 causes the selector switch 32 to select the other position in which the output 48 of the control unit 36 is connected to the programming input 14 of section EE1.

The control unit 36 then outputs at its output 48 the PROG control signal which gains access via the selector switch 32 to the programming input 14 of section EE1 where it results in the 31 first memory cells of the 31 first stages of the binary counter 24 being programmed by the logical values contained in the 31 first stages of the binary counter 24. The last stage of section EE1 is programmed with the logical value applied thereto via the negator 20 from its own output. This results in the logical value in the last stage of section EE1 being changed from 0 to 1.

It is to be noted that the logical value in section EE2 has not changed, since its programming input 16 has received no programming signal PROG.

When then the next consecutive count is to be generated, the input 38 of the control unit 36 again needs to receive the STEP signal. The receipt of this signal initiates the cycle 2 which begins by the control circuit 36 outputting the LOAD signal. By applying this signal to the input 28 of the binary counter 24 the count is produced in this counter which existed at the end of the cycle 1, namely the count 2. At the end of this step this count 2 is available at the output 34 as the next consecutive count. The next step is the generation of the INCR signal by the control unit 36, resulting in the binary counter 24 being incremented to the next count, the count 3. The change in the logical value in the LSB stage of the binary counter 24 to the logical value "1" prompts the selector switch to make a connection between the output 48 of the control unit 36 and the programming input 16 of section EE2.

The PROG signal now generated by the control unit 36 thus gains access via the selector switch 32 to the programming input 16 of section EE2 so that the logical value stored in this section EE2 is changed from 1 to 0, the contents of all memory cells of section EE1 remaining unchanged.

To generate the next consecutive count, the count 3, the control unit 36 again receives the STEP signal at the input 38. This initiates the sequence of the cycle 3. With the LOAD signal the contents of the corresponding first 31 memory cells of section EE1 of the EEPROM are loaded into the 31 first stages of the binary counter 24, and in the last stage LSB of the binary counter 24 the logical value represented by the output signal of the antivalence circuit 26 is loaded. This logical value is the logical value 1 since logical value 1 is stored in the last cell of section EE1 and the logical value 0 in section EE2. The logic involved in these two logical values in the antivalence circuit 26 produces the logical value 1, as is known.

At output 34 the next count is now available, i.e. the count 3.

By the INCR signal output form the control unit 36 at the output 46 the binary counter 24 is now incremented by one value to the count 4 so that the logical value in its last LSB stage assumes the value 0. This change in the logical value prompts the selector switch 32 to select transfer of the PROG signal subsequently output by the control unit 36 via the selector switch 32 to the programming input 14 of section EE1. This section EE1 is thus programmed by the logical values of the first 31 stages of the binary counter 24 whilst the logical value in its last memory cell is changed from logical value 1 to logical value 0 via the link between the output of the latter and the negator 29 to its input, the contents of section EE2 remaining unchanged.

It is obvious from the above discussion of the individual cycles that each cycle is activated by input 38 of the control unit 36 receiving a STEP signal and is made up of the sequential output of the LOAD, INCR and PROG signals. The desired count is retrievable every time the LOAD signal is output at the output 34. The cycles 4, 5, 6 and 7 all run just the same as has been described in conjunction with the prior cycles, whereby it is to be noted that with every cycle a count elevated by 1 is available at the output 34 and in the EEPROM 10 the contents of the last cell of section EE1 and the contents the cell forming section EE2 are changed only in every second cycle. Accordingly, no memory cell exists in the EEPROM 10 whose contents change in each consecutive cycle in incrementing the count. Since the number of safe changes in the logical values in the EEPROM memory cells is limited, this number can now be doubled by application of the sequence as discussed. From considering the last binary number in the column EE1 of the Truth Table shown in FIG. 2 and the binary number indicated in the column EE2 therein it is clearly evident that each of these binary numbers changes only in every second cycle. In spite of this, after every LOAD signal the next consecutive count can be output to the data output 34.

By means of the assembly as described it is thus possible, as mentioned, to double the number of safe change cycles of the information stored in the EEPROM 10.

What is claimed is:

1. An assembly for generating a consecutive count comprising an n-stage binary counter incrementable by counting pulses in successive cycles and an EEPROM in which an item of information representing the count achieved in each case is stored in the pauses between the cycles:

said EEPROM (10) comprises n+1 memory cells;

a control circuit (36) causing the contents of the n−1 stages of said binary counter (24) assigned to the most-significant bits to be stored in the n−1 first memory cells of said EEPROM (10) and the contents of the $n^{th}$ or $(n+1)^{th}$ memory cell is changed in alternate cycles;

on commencement of each cycle the contents of said n−1 first memory cells of said EEPROM (10) is transferred into the corresponding stages of said binary counter (24) and a bit is written into the $n^{th}$ stage (LSB) of said binary counter formed by linking the contents of said $n^{th}$ and $(n+1)^{th}$ memory cells of said EEPROM (10) such that the count corresponds to the count attained in the previous cycle, whereby the counting pulse then increments said binary counter (24) to the next count.

2. The assembly as set forth in claim 1, further comprising an antivalence circuit (26) for linking the contents of said $n^{th}$ and $(n+1)^{th}$ memory cells.

3. The assembly as set forth in claim 1 wherein the output of said $n^{th}$ memory cell is connected to the output of said $(n+1)^{th}$ memory cell in each case via a negator (20, 22) to the input of each memory cell so that every time a programming signal (PROG_EE1, PROG_EE2) is received the contents of said memory cell is changed.

4. The assembly as set forth in claim 2 wherein the output of said $n^{th}$ memory cell is connected to the output of said $(n+1)^{th}$ memory cell in each case via a negator (20, 22) to the input of each memory cell so that every time a programming signal (PROG_EE1, PROG_EE2) is received the contents of said memory cell is changed.

* * * * *